United States Patent
Weiler et al.

(10) Patent No.: US 6,595,211 B2
(45) Date of Patent: Jul. 22, 2003

(54) MAGNETIC RESONANCE IMAGING METHOD

(75) Inventors: Norbert Weiler, Otterberg (DE); Balthasar Eberle, Hahnheim (DE); Wolfgang Schreiber, Mainz (DE); Klaus Markstaller, Ingelheim (DE); Hans-Ulrich Kauczor, Wiesbaden (DE); Timothy P. L. Roberts, San Francisco, CA (US); Werner Heil, Varces-Alliers et Risset (FR); Reinhard Surkau, Mainz (DE); Anselm Deninger, Wiesbaden (DE); Lars Lauer, Mainz (DE); Tino Grossmann, Mainz (DE); Michael Ebert, Worrstadt (DE)

(73) Assignee: Medi-Physics Inc., Princeton, NJ (US)

( * ) Notice: Subject to any disclaimer, the term of this patent is extended or adjusted under 35 U.S.C. 154(b) by 0 days.

(21) Appl. No.: 09/919,879

(22) Filed: Aug. 2, 2001

(65) Prior Publication Data

US 2002/0043267 A1 Apr. 18, 2002

Related U.S. Application Data

(63) Continuation of application No. 09/057,979, filed on Apr. 10, 1998, now Pat. No. 6,370,415.

(51) Int. Cl.$^7$ .................... A61M 16/00; A61B 5/055
(52) U.S. Cl. .................... 128/204.18; 600/410
(58) Field of Search .................... 600/410, 407, 600/411, 420, 437, 439, 529, 530, 531, 532, 533, 534, 535, 536, 537, 538, 539; 424/9.3, 9.36; 128/204.18, 898

(56) References Cited

U.S. PATENT DOCUMENTS

| | | | |
|---|---|---|---|
| 4,775,522 A | 10/1988 | Clark, Jr. | .................... 424/9 |
| 5,553,255 A | 9/1996 | Jain et al. | |
| 5,586,295 A | 12/1996 | Tran | |
| 5,592,679 A | 1/1997 | Yung | |
| 5,606,675 A | 2/1997 | Sakamura et al. | |
| 5,634,103 A | 5/1997 | Dietz et al. | |
| 5,634,131 A | 5/1997 | Matter et al. | |
| 5,642,500 A | 6/1997 | Inoue | |
| 6,346,229 B1 * | 2/2002 | Driehuys et al. | ............ 424/9.1 |

FOREIGN PATENT DOCUMENTS

WO    WO 95/27438    10/1995

OTHER PUBLICATIONS

XP–002109516, Kauczor H –U: "Helium–3 Imaging of Pulmonary Ventilation" British Journal of Radiology, British Inst. Radiol. UK.

XP–000690998, Patyal B R et al., "longitudinal Relaxation and Diffusion Measurements Using Magnetic Resonance Signals from Laser–Hyperpolarized/sup 129/Xe nuclei" May 1997, Journal of Magnetic Resonance, Academic Press, USA.

XP–002109517, Saam B et al. "Nuclear Relaxation of /sup 3/He in the Presence of O/sub 2/" Jul. 1995, Physical Review A (Atomic, Molecular, and Optical Physics).

(List continued on next page.)

Primary Examiner—David J. Isabella
(74) Attorney, Agent, or Firm—Bacon & Thomas

(57) ABSTRACT

The invention provides a method of detecting regional variations in oxygen uptake from the lungs of an air-breathing animal subject, said method comprising administering into the lungs of said subject a diagnostically effective amount of a gaseous hyperpolarized magnetic resonance imaging agent, detecting the magnetic resonance signal from said agent in said lungs, determining the temporal variation in relaxation rate for said signal for at least one region of interest within said lungs, and from said variation generating a qualitative or quantitative value or image indicative of the oxygen uptake from the alveolar space in said at least one region of interest.

7 Claims, 10 Drawing Sheets

OTHER PUBLICATIONS

XP–004107386, Albert M S et al., "Development of Hyperpolarized Noble Gas MRI", Jan. 1997, 7th RCNP International Workshop on Polarized/Sup 3/He Beams and Gas Targets and Their Applications, Kobe, Japan.

XP–002066864. Kauczor H –U et al., "Normal and Abnormal Pulmonary Ventilation: Visualization at Hyperpolarized He–3 MR Imaging", Radiology, Nov. 1996, Radiol. Soc. North America, USA.

XP–000674417, Berthezene Y et al., "Contrast–Enhanced MR Imaging of the Lung: Assessments of Ventilation and Perfusion", Jun. 1, 1992, Radiology.

* cited by examiner

MAGNETIC RESONANCE IMAGING METHOD

This application is a continuation application of pending U.S. application Ser. No. 09/057,979, filed Apr. 10, 1998, now U.S. Pat. No. 6,370,415.

FIELD OF THE INVENTION

This invention relates to a method of magnetic resonance imaging of the human or animal (e.g. mammalian, reptilian or avian) body by which lung function and, if desired, morphology may be investigated.

BACKGROUND OF THE INVENTION

Lung function is of interest to physicians, especially when dealing with patients who may have abnormalities of ventilation or perfusion or other determinants of gas exchange in the lung. For proper lung function five conditions must be met:
1. gas (air) must be pumped into and out of the lungs;
2. the gas must be distributed evenly within the lungs;
3. gases must be exchanged by diffusion between the blood and the alveolar space;
4. blood must be pumped through the lungs; and
5. the distribution of the blood in the lungs should correspond to the distribution of gas in the alveolar space (i.e. where the gas penetrates to, blood should flow).

All diseases and ailments relating to the lungs and airways affect one or more of the five conditions above.

It has therefore been known to study lung ventilation and perfusion using various diagnostic techniques. The conventional technique is known as VQ imaging and involves the use of two different radiopharmaceuticals, one to study perfusion and the other to study ventilation.

The perfusion agent is generally a particulate (e.g. $^{99m}$Tc-microaggregated albumin) which is administered intravenously upstream of the lungs and lodges in the precapillary arterioles.

An image of the lungs is recorded with a gamma camera and the signal intensity may be used to detect local abnormalities in blood flow.

The ventilation agent is generally a radioactive gas or aerosol or microparticulate, e.g. $^{133}$Xe, $^{127}$Xe or $^{81m}$Kr, or a $^{99m}$Tc-DTPA aerosol or $^{99m}$Tc-labelled carbon particles. The agent is inhaled and an image is recorded with a gamma camera. Signal intensity and distribution may be used to detect airway obstructions or regional abnormalities in ventilation.

Where there is a mismatch between the ventilation and perfusion images (which are generated at different times), various different lung malfunctions, diseases or abnormalities may be diagnosed, e.g. pulmonary embolism, pleural effusion/atelectasis, pneumonia, tumour/hilar adenopathy, pulmonary artery atresia or hyperplasia, fibrosing mediastinitis, AVM, CHF, pulmonary artery sarcoma, and intravenous drug use. Heterogenous perfusion patterns may likewise be used to diagnose various disease states or disorders, e.g. CHF, lymphangitic carcinomatosis, non-thrombogenic emboli, vasculitis, chronic interstitial lung disease, and primary pulmonary hypertension. Decreased perfusion to one lung may be used to diagnose pulmonary embolism, pulmonary agenesis, hypoplastic lung (pulmonary artery atresia), Swyer-James syndrome, pneumothorax, massive pleural effusion, tumour, pulmonary artery sarcoma and shunt procedures for congenital heart disease.

VQ imaging however involves exposing the patient to radiation doses from two radiopharmaceuticals in two temporally separate imaging procedures. Clearance of the injected particulate agent is relatively slow and the agent is taken up in other organs besides the lungs. Moreover, in patients with severe pulmonary hypertension, the injected particulate causes a risk of acute right heart failure. For pregnant patients the radiation dose involved in VQ imaging results in undesirable levels of radiation exposure for the foetus.

Furthermore, for most diagnostic purposes mentioned above the resolution of conventional VQ imaging is unsatisfactory.

There is thus a need for a technique which permits lung function to be assessed without the drawbacks associated with VQ imaging.

In magnetic resonance (mr) imaging, radiofrequency signals from non-zero spin nuclei which have a non-equilibrium nuclear spin state distribution are detected and may be manipulated to provide images of the subject under study. In conventional mr imaging the nuclei responsible for the detected signals are protons (usually water protons) and the non-equilibrium spin state distribution is achieved by placing the subject in a strong magnetic field (to enhance the population difference between the proton spin states at equilibrium) and by exposing the subject to pulses of rf radiation at the proton Larmor frequency to excite spin state transitions and create a non-equilibrium spin state distribution. However the maximum deviation from equilibrium is that achievable by spin state population inversion and, since the energy level difference between ground and excited states is small at the temperatures and magnetic field strengths accessible, the signal strength is inherently weak.

An alternative approach that has been developed is to "hyperpolarize" (i.e. obtain a nuclear spin state population difference greater than the equilibrium population difference) an imaging agent containing non-zero nuclear spin nuclei (e.g. by optical pumping, by polarization transfer or by subjecting such nuclei ex vivo to much higher magnetic fields than those used in the mr imaging apparatus), to administer the hyperpolarized agent to the subject, and to detect the mr signals from the hyperpolarized nuclei as they relax back to equilibrium. In this hyperpolarized mr imaging technique, described for example in WO95/27438, the hyperpolarized material is conveniently in gaseous form, e.g. $^3$He or $^{129}$Xe, and it may thereby be administered by inhalation into the lung and the mr signal detected may be used to generate a morphological image of the lungs.

Since the relaxation time $T_1$ for $^3$He in the lungs is about 10 seconds it is feasible, using fast imaging techniques, to generate a morphological image of the lungs from the $^3$He signal following inhalation of hyperpolarized $^3$He gas and at any desired stage of the breathing cycle, e.g. during breath-hold. Since the mr signal selected is from the $^3$He atoms and since the helium is in the gas phase in the lungs, the image detected is essentially only of the airways into and within the lungs. By administering the hyperpolarized agent as a bolus followed or preceded by other gases or aerosols, e.g. by air, nitrogen or $^4$He, the hyperpolarized agent can be positioned at any desired section of the airways or other aerated spaces in the body, e.g. it may be flushed from the trachiobronchial tree and the image generated is then essentially only of the alveolar space.

We have now found that functional imaging of the lungs may be carried out effectively using mr imaging of an inhaled hyperpolarized agent by making use of the variation with time of the relaxation rate $T_1$ of the hyperpolarized agent.

SUMMARY OF THE INVENTION

Viewed from one aspect therefore, the invention provides a method of detecting regional variations in oxygen uptake from the lungs of an air-breathing animal subject, e.g. a mammalian (human or non-human), avian or reptilian subject, said method comprising administering into the lungs of said subject a diagnostically effective amount of a gaseous hyperpolarized magnetic resonance imaging agent, detecting the magnetic resonance signal from said agent in said lungs, determining the temporal variation in relaxation rate (e.g. $T_1$ relaxation rate) for said signal for at least one region of interest within said lungs, and from said variation generating a qualitative or quantitative value or image indicative of the oxygen concentration in the alveolar space in said at least one region of interest, and if desired the time dependency of such concentration as a result for example of physiological process, e.g. oxygen uptake by perfusion.

In a preferred embodiment, the method of the invention also involves generation of a temporal and/or spatial image of the distribution of the hyperpolarized agent in at least part of the lungs of the subject, preferably in the alveolar space within the lungs.

In a further preferred embodiment, the method also involves generation of a magnetic resonance image of at least part of the lungs of the subject following administration into the subject's vasculature of a second mr agent, preferably an agent which affects proton relaxation (with the image generated being a proton mr image) or more preferably an agent containing non-proton mr active nuclei (e.g. $^{19}F$, $^{13}C$, $^{31}P$, etc.) in which case the mr image will be generated from mr signals from such non-proton mr active nuclei. The mr active nuclei in the second agent will preferably not be the same as those in the hyperpolarized agent unless the image generated using the second agent is generated at a time when the lungs contain substantially none of the hyperpolarized agent.

Lung volume may also be estimated from the integrated $^3$He mr signal (or by $^3$He mrs) following inhalation of the $^3$He without air, breathhold, and expiration where the expired volume is measured directly and the residual hyperpolarization of the retained $^3$He is extrapolated from the hyperpolarization value (signal strength) monitored during breathhold.

In the method of the invention, it is preferred that for at least part of the mr signal detection period (preferably at least 1 second, more preferably at least 5 seconds, still more preferably at least 10 seconds, e.g. 20 sec to 1 minute), there be substantially no flow of gas into or out of the lungs, e.g. that there should be a breathhold period, and that the indication of oxygen uptake be derived from mr signals detected during at least part of this period. However, in a preferred embodiment, the method of the invention will also involve mr signal detection during gas flow into and/or out of the lungs with or without a period of breathhold. In this way, spatial or temporal images or other indications of lung ventilation may be generated from the detected mr signals.

Because the detected mr signal derives from the hyperpolarized agent, the signal strength is effectively independent of the primary field strength of the magnet in the mr imager. Accordingly low or high field, e.g. 0.05 to 3.5 T, machines may be used.

DESCRIPTION OF THE DRAWINGS

The method of the invention is illustrated by the attached drawings, in which.

DETAILED DESCRIPTION OF THE INVENTION

Figure 1A:
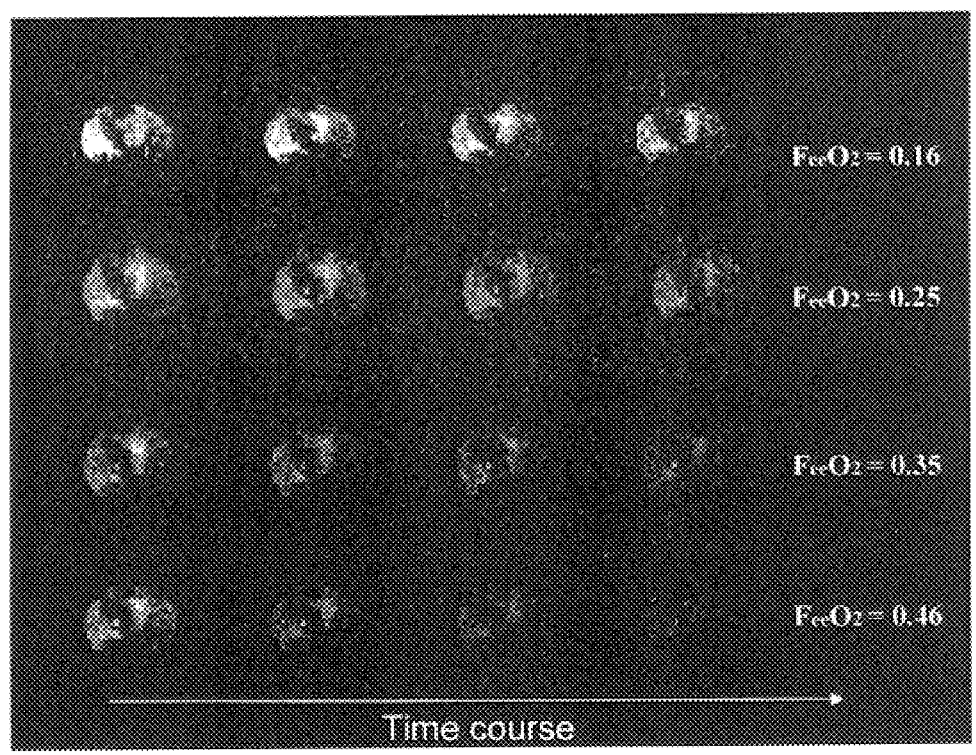
FIGS. 1a and 1b show $^3$He mr images showing the effect of oxygen and flip angle on the images obtained using a 40 mL bolus of $^3$He.
Figure 1B:
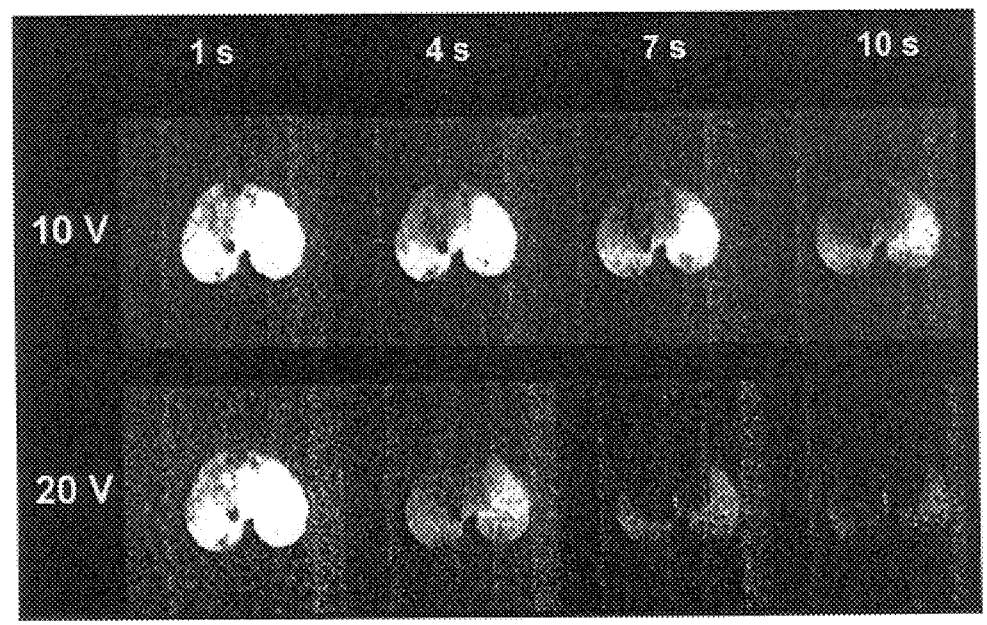

The method of the invention involves administration of a gaseous hyperpolarized mr agent. By a gaseous agent is meant a gas as such (e.g. $^3$He or $^{129}$Xe) or a particulate agent held in the gas phase, e.g. an aerosol of powder or droplets. In the latter case, the gaseous carrier preferably is substantially free of paramagnetic gases such as oxygen. The hyperpolarized agent will conveniently have a polarization degree P of 2 to 75%, e.g. 10 to 50%. The mr active (i.e. non-zero nuclear spin) nuclei which are hyperpolarized may be any mr active nuclei which can be hyperpolarized and which can be presented in a gaseous form (ie elemental or molecular form) which is physiologically tolerable. Examples of appropriate nuclei include various noble gas, carbon, nitrogen and fluorine isotopes; however the noble gases, e.g. He and Xe, and most especially $^3$He, are the most preferred. Accordingly, the discussion below will present the invention in terms of $^3$He-mr imaging although it does as indicated above, extend to cover the use of other mr active nuclei.

During steady state, oxygen transport within the functional units of the lung, i.e. the alveolocapillary unit is characterized by a relationship governed by mass conservation:

The net amount of oxygen entering the alveolocapillary unit by the airways has to be equal to the net amount of oxygen leaving the alveolocapillary unit on the blood side. This may be expressed by the equation:

$$V'\cdot(F_IO_2-F_EO_2)=Q\cdot(c_aO_2-c_vO_2) \quad (1)$$

V'=ventilation
Q=perfusion
$F_IO_2$=fractional inspiratory concentration of oxygen
$F_EO_2$=fractional expiratory concentration of oxygen
$c_aO_2$=oxygen content of arterial blood
$c_vO_2$=oxygen content of mixed venous blood
Rearrangement of equation (1) provides the following equation for the ventilation-perfusion ratio V'/Q:

$$\frac{V'}{Q} = \frac{c_aO_2 - c_vO_2}{F_IO_2 - F_EO_2} \qquad (2)$$

Oxygen contents as well as fractional oxygen concentrations can both be written as functions of oxygen partial pressure, yielding the following equation:

$$\frac{V'}{Q} = \frac{k(p_aO_2 - p_vO_2)}{(p_IO_2 - p_EO_2)} + f(p_aO_2 - p_vO_2) \qquad (3)$$

Assuming complete equilibration of oxygen partial pressures across the alveolocapillary membrane, $p_aO_2$ will be equal to $p_EO_2$:

$$\frac{V'}{Q} = \frac{k(p_aO_2 - p_vO_2)}{(p_IO_2 - p_EO_2)} + f(p_aO_2 - p_vO_2) \qquad (4)$$

Both k and f depend on a variety of factors, e.g. on barometric pressure, the solubility constant of oxygen in plasma, the dissociation curve of oxygenated haemoglobin, etc., all of which are known.

Until now, quantitative description of these oxygen transport processes was possible only on a global basis for the whole organism.

With the present invention one is able to measure these processes regionally in the lung. The method may be used to measure regional ventilation, regional partial pressure of oxygen and its time course, with high spatial and temporal resolution.

Regional oxygen partial pressure may be measured by hyperpolarized $^3$He magnetic resonance imaging.

To this end, ultrafast MRI sequences are preferably used allowing sequential measurements of the $^3$He signal, and its decay, which is dependent both on oxygen and MR acquisition (see FIGS. 1a and b). Signal decay induced by the MR sequence is corrected for by variation of the flip angle and/or of the inter-scan delay.

Figure 2:
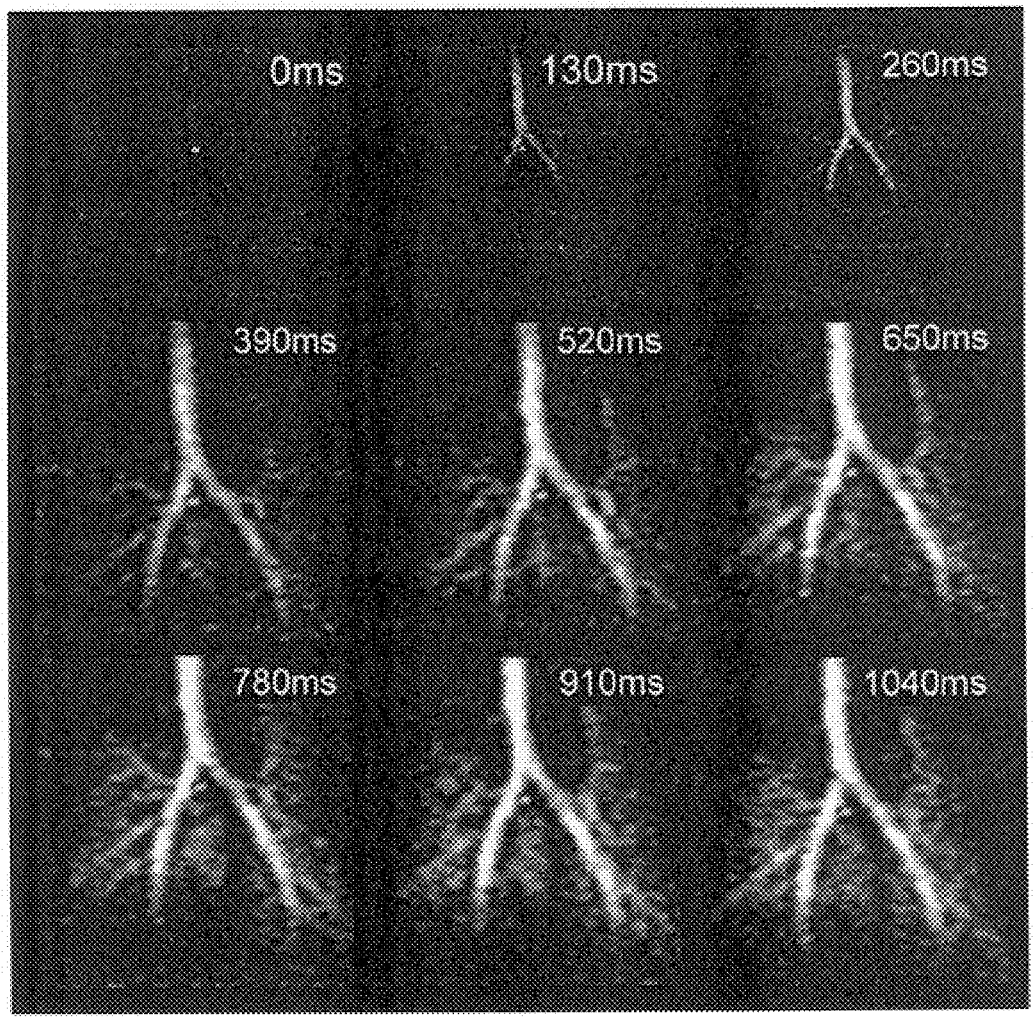
FIG. 2 shows $^3$He mr images of the airway.

Oxygen concentration inspired into the alveolocapillary unit is not constant during a single inspiration, due to the contribution of deadspace. Therefore, mean inspiratory concentration may be calculated based upon determination of deadspace (from airway imaging by $^3$He; see FIG. 2), and from the inspiratory concentration administered at the mouth.

Figure 3:
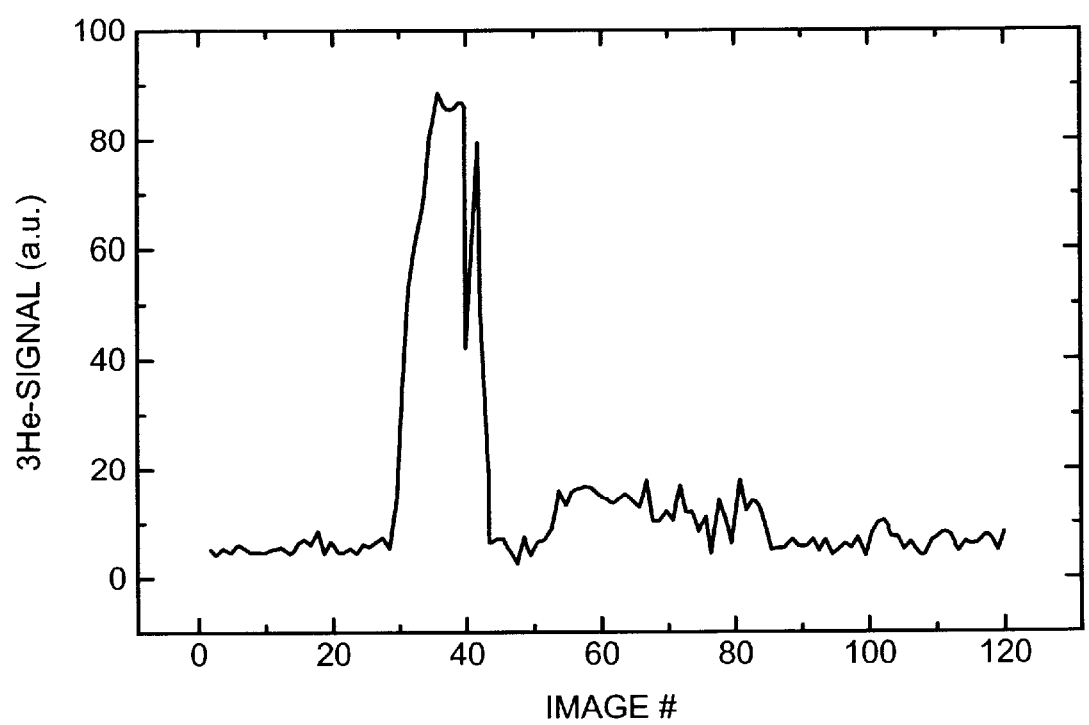
FIG. 3 shows the $^3$He mr signal strength in the trachea during inspiration and breathhold where a bolus of $^3$He is estimated.

Regional ventilation may be measured by determining the regional change in hyperpolarization signal, normalized to the integral over the signal-time curve found in the trachea and the measured volume of the 3He bolus (see FIG. 3).

Knowing intraalveolar oxygen partial pressure and mean inspiratory oxygen partial pressure, the local V'/Q ratio can be calculated; the addition of local ventilation then allows calculation of regional perfusion. With the assumption that local arterial $pO_2$ equals alveolar $pO_2$, local oxygen uptake can be derived. Thus, for the first time, a complete status of regional oxygen transport in the lung can be obtained.

The preferred MRI sequences for use in the method of the invention are:
- for oxygen partial pressure determination, short repetition time gradient-recalled echo sequences with small flip angle; and
- for determination of ventilation, ultra-short repetition time (<2 ms) gradient-recalled echo sequences with small flip angle, or echo-planar pulse sequences, or ultra-fast sequences using low flip angle and free induction decay.

The theory of $^3$He-MR-based on $pO_2$ analysis will now be discussed briefly:

The decay of longitudinal magnetization, and hence signal intensity, that occurs with any mr acquisition, follows a function given by:

$$S_{n+1,a}(r) = S_n * \cos^r a \qquad (5)$$

where n is the number of image acquisition, r is the number of radiofrequency impulses (lines) per image acquired, and a is the flip angle imposed by each consecutive radiofrequency impulse upon the nuclear spin polarization of $^3$He in the acquisition volume.

Simultaneously, signal intensity ($S_n$) also begins to decay according to an exponential function, to arrive (within a given time interval Dt) at $S_{n+1}$:

$$S_{n+1,Dt}(t) = S_n * e^{-Dt/T_1} \qquad (6)$$

The time constant of this decay is determined by the longitudinal spin relaxation time of $^3$He, $T_1$, which is shortened in the presence of paramagnetic molecular oxygen.

In in vitro experiments, the following relationship between $T_1$ and oxygen concentration $[O_2]$ in a gas mixture containing hyperpolarized $^3$He has already been established to be:

$$T_1(O_2) = 2.25 \text{ bar}*s/[O_2] \qquad (7)$$

($T_1$ in seconds; $[O_2]$ as fraction of 1 bar)

The combined effects of acquisition and time result in a decay function of:

$$S_{n+1}(a,t) = S_n * \cos^r a * e^{-Dt/T_1} \qquad (8)$$

Inserting (7) into (8) yields a relationship that describes the combined effects of flip angle a and $[O_2]$ upon the decay of signal intensity over time.

$$S_{n+1}(a,[O_2],t) = S_n * \cos^r a * e^{-Dt/T_1[O_2]/2.25} \qquad (9)$$

(Dt in s; $[O_2]$ as fraction of 1 bar)

Rearranged, this allows one to either derive $[O_2]$ from a pair of signal intensity determinations separated by a known time interval Dt, if flip angle a can be estimated with sufficient accuracy:

$$[O_2] = (2.25/Dt) * \ln(S_n * \cos^r S_{n+1}) \qquad (10)$$

or to estimate flip angle a (in degrees) from:

$$a = (180/\pi) * \arccos[(e^{Dt*[O_2]/2.25} * S_{n+1}/S_n)^{1/r}] \qquad (11)$$

if $[O_2]$ is known and sufficiently stable during acquisitions n and n+1.

Hyperpolarized helium-3 ($^3$He) can be produced by means of direct optical pumping from the metastable state $1s2s^3S_1$ at 1 mb with subsequent conversion to convenient pressures of 1–6 bar. Surkau et al in Nucl.Inst.& Meth. A384: 444–450 (1997) describe apparatus which can be used to produce $^3$He with a polarization degree P of at least 50% at a flow of $3.5 \times 10^{18}$ atoms/sec. or 40% at a flow rate of $8 \times 10^{18}$ atoms/sec. The hyperpolarized gas may then be filled into glass cylinders, e.g. made of glass which has a low iron content and no coating. These cylinders can be closed by a stop-cock and transported to the mr imaging site, preferably within a magnet, eg a 0.3 mT magnet. Under such conditions, the $^3$He has a relaxation time ($T_1$) of up to 70 hours.

To perform $^3$He mr imaging, the hyperpolarized gas is preferably administered in a bolus into an application unit through which the subject under study may breath freely or alternatively ventilation may be supported by artificial ventilation. For non-human subjects at least, artificial ventilation apparatus will preferably be used and the animals will preferably be anaesthetized and relaxed. For humans, with whom voluntary breathhold is feasible, free breathing through the ventilation unit will generally be preferred. In this way, the $^3$He bolus, conveniently of 1 to 1000 ml, may be administered at a desired point within the breathing cycle, generally at or close to the beginning of inspiration. The bolus size used will depend on the lung size or tidal respiration volume of the subject and will thus vary with subject size or species. However a bolus of 2 to 50%, preferably 5 to 25%, of tidal respiration volume may be suitable.

On inspiration the $^3$He bolus passes into the airways within about one second with alveolar filling occurring rapidly thereafter for healthy/unobstructed tissue. If inspiration is followed by a period (e.g. of 1 to 60 seconds during which there is substantially no gas flow into or out of the lungs, e.g. a period of breathhold), the $^3$He-mr signal gradually decays at a relaxation rate of the order of 10 seconds. The relaxation rate however is not constant spatially or temporally. Three significant factors contribute to this: loss of polarization due to the magnetic field changes required for mr imaging; loss of polarization due to relaxation enhancement by gaseous oxygen present in the lungs; and loss of polarization due to relaxation enhancement by the tissue/gas boundary. If the same imaging sequence(s) is used throughout the signal detection period, then the first and third of these factors are constant during a period of no gas flow to/from the lungs; however, $^3$He filled volumes as well as oxygen concentration will vary due to physiological processes, e.g. as oxygen is taken up from the lungs in the alveolar space. As a result, in a region of interest where oxygen concentration drops the $^3$He relaxation time will increase with time even though absolute signal intensity will continue to drop.

While relaxation rate enhancement by lung tissue plays a subordinate role in terms of the overall contributions to the $^3$He relaxation rate, it does have a non-uniform effect as different tissues or abnormalities have different effects on the relaxation rate. It is thus preferred not to estimate the oxygen contribution to the relaxation rate by simple reference to a phantom undergoing the same field gradient changes as the subject's lung. Use of a phantom is similarly non-preferred due to the inhomogeneity in the applied field across the volume in which the $^3$He distributes. Accordingly it is preferred to extract the oxygen contribution to the relaxation rate by mr signal detection during at least two different types of signal generation, e.g. with the different sequences being interleaved. Thus for example the different sequences may involve different RF excitation intensities and/or different sequence intervals ($\tau$).

The magnetic field change contribution to the relaxation is desirably minimized so as to prolong the period over which a signal with an acceptable signal to noise ratio can be detected. This is generally achieved by using small flip angles (e.g. less than 7°, preferably less than 4°) in the imaging sequences and in this way mr signals may be detected for up to 60 seconds following bolus $^3$He administration.

For $^3$He-mr imaging, because of the relatively short duration of the hyperpolarization and because relaxation rate change over time is to be studied, it is of course appropriate to use rapid image generating techniques, e.g. fast gradient echo techniques or other techniques with an image acquisition time of less than 2 seconds, preferably 1 second or less. Such techniques are mentioned elsewhere in this specification. Images generated in this way may have a spatial resolution (i.e. voxel size) of less than 20 mm$^2$, which is far superior to the scintigraphic ventilation images in conventional VQ imaging.

The regions of interest studied in the method of the invention will generally be the alveolar space and thus it is generally preferable that the $^3$He bolus be followed in the same gas intake by air or nitrogen to flush the $^3$He from the tracheobronchial tree and into the alveolar space.

As mentioned above, the method of the invention may, and probably will, involve generation of ventilation images, showing spatial and/or temporal distribution of $^3$He, thereby permitting ventilation and perfusion to be determined in the same imaging procedure (unlike VQ imaging). On a morphological level, such ventilation images may identify airway obstructions simply by identifying regions to which the $^3$He does not penetrate, penetrates slowly, or penetrates at lower than normal concentrations. Obstructions and associated hypoperfusion, normal perfusion or hyperperfusion can also be identified by following the time dependence of the $^3$He relaxation rate for slowly penetrated alveolar space as the oxygen concentration in such areas may be abnormally low or high. Thus while the mr signal strength may initially be abnormally low, the local relaxation rate may be or become abnormally high or low.

Thus if local perfusion does not match local ventillation, oxygen concentration in that part of the lung will be affected and measurable by the method of the invention due to the local abnormal relaxation rate. This would be important in the case of patients with lung malfunction due to smoking.

As also mentioned above, $^3$He mr imaging may be combined with perfusion imaging using a second imaging agent administered into the vasculature, e.g. a blood pool agent such as a polymeric paramagnetic chelate, or a superparamagnetic agent or, more preferably, a $^{19}$F fluorocarbon emulsion. In the former cases, imaging would be proton mr imaging, in the latter case $^{19}$F mr imaging. However, the perfusion data collected in this way, although equivalent to the perfusion data collected in VQ imaging, is not absolutely equivalent to that generated in the method of the invention since the second imaging agent distribution merely identifies the regions of the lung to which blood flows and not whether or not oxygen uptake by the blood occurs in such regions. Accordingly, the perfusion data from the method of the invention provides a more accurate portrayal of lung function.

The method of the invention may be used as part of a method of diagnosis of lung malfunction, disease, etc. or indeed in combination with a method of treatment to combat, i.e. prevent or cure or ameliorate, a lung malfunction or disease, etc., e.g. a method involving surgery or administration of therapeutic agents or a method of diagnosis of one of the lung malfunctions or diseases mentioned above. Such methods form further aspects of the present invention as does the use of $^3$He (or other mr active nuclei containing materials) for the preparation of a hyperpolarized imaging agent for use in methods of treatment or diagnosis involving performance of the method of the invention.

All documents referred to herein are hereby incorporated by reference.

The invention will now be illustrated further by reference to the following non-limiting Examples:

EXAMPLE 1

The objectives in this Example were to realize single-breath, single-bolus visualization of intrapulmonarily administered $^3$He to analyse nuclear spin relaxation of $^3$He in vivo and to determine the regional [$O_2$] and its time dependent change by perfusion. A double acquisition technique is described which also permits estimation of regional gas transport.

In these examinations, the source of the MR signal is the large non-equilibrium polarization of $^3$HE. This polarization is achieved by means of direct optical pumping from its metastable state $1s2s^3S_1$ at 1 mb with subsequent compression to a convenient pressure of 1–6 bar. The apparatus is described by Surkau et al. Nuc. Instr. & Meth. A 384 (1997) 444–450 and is capable of yielding P>50% at flow of $3.5 \times 10^{18}$ atoms/s and 40% at flow $8 \times 10^{18}$ atoms/s. The gas is filled into glass cylinders with long relaxation times. Cylinders for medical application are made from "Supremax glass" with low iron content and no coating. They show relaxation times up to 70 h and can be closed by a stop cock and disflanged from the filling system. Transport from the filling site to the MR imaging unit takes place inside a dedicated 0.3 mT guiding field. To perform $^3$He-MRI experiments reproducibly, an application system was used. Predefined quantities of $^3$He gas at 1 bar pressure can be inserted into breath at a predefined position. Volunteers or patients can breathe freely through the application unit or ventilation can be supported by a commercial respiration machine with controlled pressure. For studies with anesthetized and relaxed animals ventilation is by a respiration machine.

Relaxation of the non-equilibrium polarization of inhaled $^3$He in vivo is mainly caused by NMR excitations and the presence of oxygen. Relaxation by lung tissue plays a subordinate role as shown by experiments below. The time evolution of the polarization P inside a two-dimensional partition inside ventilated lung spaces can be described by rate equations. Considering the flip angle $\alpha$ and the partial oxygen pressure po we define a time-averaged relaxation rate by NMR via the equation $$\Gamma_{RF} = \frac{1}{\Gamma} \int_O^T -\frac{\ln(\cos \alpha)}{T_R} dt \quad (12)$$

(where T=duration of measurement and $T_R$=repetition time) and by oxygen via the equation $$\Gamma_{O_2} = \frac{1}{k} p_o(t)$$

k=2.25 bar.s is used referring to 299 Kelvin [see Saam et al. in Phys. Rev. A 52 (1995) 862–865]. Since $p_o$ changes in vivo by oxygen consumption, $p_o$ is taken as a function of time t. Gas exchange from neighbouring volumes with polarization P', e.g. by diffusion, is taken into account by an exchange rate $\gamma$, weighted with the polarization difference (P–P'). Assuming only relaxation by oxygen for P', the time dependence of P is integrated to:

$$P(t) = \frac{P_O}{\gamma + \Gamma_{RF}} \{ \Gamma_{RF} e - \int \{\Gamma_{O_2}(t) + \Gamma_{RF}(t)\} dt + \gamma e - \int (\Gamma_{O_2}(t) dt) \} \quad (14)$$

Experiments have been carried out to investigate P(t) in dependence of the given parameters. Signal intensities were averaged and analysed over regions of interests (ROIs). An intensity correction for noise was performed following the method of Gudbjartsson et al., MRM 34 (1995) 910–914. The noise corrected signals $A_n$ of the $n^{th}$ image (n=0, 1, . . . ) are assumed to be proportional to $P_n$. The data are normalized and linearized by calculating $R_n$=ln ($A_n/A_o$).

Parameter extraction is done in two steps. As long as the polarization difference P–P' is small (the first 4 to 6 images), the effect of gas exchange is not readily seen and $\gamma$ is set to 0 in equation (14). The flip angle a as well as $p_o$ contribute to a monoexponential decay of P(t), hence a double acquisition technique is necessary for determination. Two approaches may be used: two series of images are taken using different RF excitation intensities $U_1$ and $U_2$ or different intervals $\tau_1$ and $\tau_2$. These yield series of data $D_n = R_n(U_1) - R_n(U_2)$ and $E_n = R_n(\tau_1) - R_n(\tau_2)$. As far as $D_n$ and $E_n$ are linear (no significant gas exchange), $\alpha$ can be fitted from $D_n$ and $p_o$ from $E_n$. The second missing parameter is then derived from equation (14) by fitting one of the data sets $R_n$. Temporal evolution of $P_o$ by oxygen consumption was found to be linear during the period of measurement ($\leq$40 s), thus $p_o(t) = p_o - m.t$ was defined. Oxygen consumption and gas exchange both influence the time dependence of $T_1$. To suppress a diffusional influence and to extract m correctly, all spins have to be equally excited (P–P'$\approx$0 for all times). This can be generally done by using thick partitions in 2D MRI or by 3D MRI and should be done for analysing the $E_n$ data set correctly. On the other hand, if m is known, $\gamma$ can be fitted using equation (14) and taking into account all data points $D_n$ or $E_n$.

Eight anesthetized pigs (27 kg) were normoventilated inside an MRI unit (Siemens Vision Scanner with B=1.5 T, equipped with one of two transmit/receive coils resonant to $^3$He at 48.44 MHz). After administering a $^3$He bolus, one series of Turbo 2D FLASH images were taken during breathhold. Predefined RF excitation intensities U between 5 and 20 Volts and intervals $\tau$ between 1 and 7 s were used. Breathholds with different [$O_2$] were performed. Measurements before and after cardiac arrest checked different $p_o$ time evolutions. End-tidal $p_o$ was monitored by an oxygen meter with 10 mb accuracy. Thin and thick partitions were used (20 mm and 120 mm in coronal orientation) to demonstrate the influence on gas exchange. Imaging might be performed using boli varying between 40 and 250 cm$^3$. However, $^3$He volumes of about 100 cm$^3$ were used for all measurements of this Example. Thus, the alveolar space was rendered visible, as following air flushed the tracheobronchial tree. Wall relaxation in the investigated volumes is negligible. After cardiac arrest, $O_2$ was washed out by giving pure $N_2$ for 15 minutes. NMR corrected longitudinal relaxation time was found to be $T_1$=262 s, in accordance with a possible residual $p_o \approx$10 mb. Assuming wall relaxation only, lung, tissue shows a cm/hour rate of at least $\Gamma_1 < \frac{1}{10}$ cm/hour for spherical alveolar space with radius r=200 $\mu$m. This value is smaller than that of most bare glass surfaces (see Heil et al. in Phys. Lett. A 201 (1995) 337–343). Regional $p_o(t)$ was often found to match end-tidal monitored values within a systematical uncertainty between 3% and 10%. Using a doubly resonant coil ($^1$H and $^3$He), $\alpha$/U varied over the pig lung from 0.34 to 0.36 deg/Volt. m and $\gamma$ corresponded to adjusted experimental conditions. Analysing ROIs with same center and different sizes down to 1 cm$^2$ (around 60 voxels) leads to identical parameters as long as the intensity distribution is Rician and S/N>2. These results were exemplarily confirmed with two human volunteers. Thus, the quantifiable in vivo effect of intrapulmonary $O_2$ upon $T_1$ offers an instrument for analysis of intrapulmonary [$O_2$] and its time course with a regional resolution so far unmatched by any conventional method. Besides regional lung ventilation, oxygen consumption is also measured at the same time by non-invasive MRI from which local perfusion can be calculated knowing other physiological parameters.

EXAMPLE 2

Five anaesthetized pigs (27 kg) underwent controlled ventilation in an MRI unit (1.5 T). Using an applicator, measured boli of $^3$He were administered at the beginning of inspiration. A dedicated Helmholtz coil tuned to 48.4 MHz allowed serial $^3$He imaging of the lungs during inspiratory apnoea. High temporal resolution could be achieved using a Turbo 2D FLASH sequence with short acquisition times of 1 second. Image interpretation was performed analysing transverse supra-diaphragmatic pulmonary cross-sections.

Measurement (i) $T_1$ was determined from the decay of signal intensity in a series of 9 subsequent MR images;

(ii) the calibration of $T_1$ versus $[O_2]$ was performed by repeating this experiment using an end-tidal $[O_2]$ of 0.16, 0.25, 0.35, 0.45, and varying of $^3$He exposure time to oxygen at inspiratory hold;

(iii) the influence of perfusion on alveolar $[O_2]$ was determined by imaging before and after induction of cardiac arrest.

Results:

Bolus volumina of 95±4 mL hyperpolarized $^3$He, positioned at the beginning of inspiration, were administered reproducibly. Longitudinal relaxation time $T_1$ in vivo showed a linear correlation to measured end-tidal $[O_2]$ as an effect of oxygen consumption. The absence of perfusion caused $T_1$ derived $[O_2]$ to linear correlate to $FiO_2$ administered.

Conclusions:

Visualization of small quantities of inhaled hyperpolarized $^3$He in the lungs is feasible. Calibration of $T_1$-derived $[O_2]$ values against end-tidal $[O_2]$ and against exposure time to oxygen is possible, allowing regional measurement of intraalveolar $[O_2]$. Thus, $T_1$ derived measurement of intrapulmonary $[O_2]$ in vivo offers a novel instrument for the regional analysis of intrapulmonary $[O_2]$, its time course and, hence, its transfer into the blood. In addition, this method may allow detailed studies upon regional distribution of ventilation for pre-post-operative assessment of lung function.

EXAMPLE 3

6 pigs underwent controlled ventilation within a 1.5T MR scanner. An application system allows for bolus administration of $^3$He at pre-defined positions within the tidal volume. During the following inspiratory breathhold, dynamic scans (temporal resolution 1 sec) were acquired using a transmit-receive $^3$He-coil, and $T_1$ relaxation times were calculated. Interventions included variation of end-tidal oxygen concentration (0.16, 0.25, 0.35, 0.45) and perfusion (before/after cardiac arrest).

Bolus volumes of 20–100 mL $^3$He were administered reproducibly. The oxygen dependency of $T_1$ was confirmed in vivo. Significantly different $T_1$-time courses were found for the four different oxygen concentrations (p<0.05). Thus, a calibration curve for regional oxygen measurements can be calculated before cardiac arrest, $T_1$-derived oxygen measurements depended on perfusion and oxygen consumption whereas after cardiac arrest, they demonstrated inspiratory oxygen concentration.

The effect of oxygen upon $T_1$ in vivo allows for analysis of intraalveolar oxygen and its time course with high spatial resolution.

EXAMPLE 4

Six anaesthetized healthy pigs (28±1 kg) were normoventilated inside an MRI unit (1.5 T) with different inspiratory $[O_2]$. Using an applicator, boli of $^3$He (up to 35–45% polarized) were administered at a predefined position within the tidal volume. During subsequent inspiratory apnoea, serial $^3$He images of airways and lungs were acquired (Helmholtz transmitter-receiver coil tuned to 48.4 MHz; Turbo 2D FLASH sequences). Interventions included 1) variation of $^3$He bolus size and positioning, and 2) variation of end-tidal $[O_2]$. The decay of signal intensities in various regions of interest (ROI) was analysed.

$^3$He bolus administration was possible with sufficient accuracy and reproducibility (40 mL bolus; 39±1 mL; 100 mL; 100±4 mL; n=25; means±SD), and with negligible loss of hyperpolarization. This allowed clear visualization, by MRI, of inspiration and distribution of single $^3$He boli in the tracheobronchial tree and lungs. In vivo longitudinal spin relaxation time ($T_1$) of hyperpolarized $^3$He demonstrated a similar relationship to ambient $[O_2]$ as has been found in vitro (see Phys. Rev. A 52: 862 (1995)). Analysis of MR signal decay in defined ROIs of transverse $^3$He images yielded values for regional intrapulmonary $[O_2]$ which correlated well with end-expiratory $[O_2]$.

EXAMPLE 5

Five anaesthetized pigs (27 kg) underwent controlled ventilation in an MRI unit (1.5 T). Using an applicator, measured boli of $^3$He (35–45% polarized) were administered at a pre-defined position within the tidal volume (VT). During subsequent inspiratory apnoea, serial $^3$He images of airways and lungs were acquired using a Helmholtz transmitter-receiver coil tuned to 48.4 MHz, and Turbo 2D FLASH sequences. Interventions included 1) variation of $^3$He bolus size and positioning within $V_T$, and 2) variation of end-tidal $[O_2]$.

Results:

1) Bolus volumina of 20–300 mL $^3$He were administered reproducibly, and were positioned from 60 mL after start of $V_T$ to end-inspiration (precision>95%). This allowed clear MRI visualization of $^3$He boli as small as 40 mL, placed within transverse supradiaphragmatic pulmonary cross-sections as well as within coronal sections of the tracheobronchial tree. 2) Predicted in vitro $[O_2]$ dependency of longitudinal relaxation time $T_1$ was confirmed in vivo. Calibration of $T_1$-derived $[O_2]$ values against end-tidal $[O_2]$ was possible, allowing regional measurement of intraalveolar $[O_2]$.

Conclusions:

Single-breath, single-bolus visualization of very small quantities of inhaled $^3$He in airways and lungs is feasible. This allows detailed studies into regional distribution and ventilation. In addition, the quantifiable in vivo effect of intrapulmonary $[O_2]$ upon MRI-measurable $T_1$ offers an instrument for the analysis of intrapulmonary $[O_2]$, its time course, and hence its transfer into the blood, with a regional resolution so far unmatched by any conventional method.

EXAMPLE 6

Five anaesthetized pigs (27 kg) underwent controlled ventilation in an MRI unit (1.5 T). Using an application system, the bolus volume of $^3$He was varied between 20 mL and 100 mL. During subsequent inspiratory apnoea, serial $^3$He images of airways and lungs were acquired using a dedicated Helmholtz coil tuned to 48.4 MHz. Short acquisition times of 1 second (=temporal resolution) could be obtained by using a fast two-dimensional FLASH sequence (TR=11 ms, TE=5 ms). Image interpretation was performed upon transverse supradiaphragmatic pulmonary cross-sections as well as within coronal sections of the tracheobronchial tree. Interventions included variation of (1) end-tidal [$O_2$] (0.16, 0.25, 0.35 and 0.45); (2) of α (10 volts and 20 volts) and (3) perfusion (measurements before and after induction of cardiac arrest).

Results:

Bolus volumina of 20–100 mL—positioned from 60 mL after start of tidal volume to end-inspiration—could be administered reproducibly, allowing clear MRI visualization of $^3$He boli as small as 40 mL:

(1) In vitro predicted $O_2$ dependency of longitudinal relaxation time ($T_1$) could be confirmed in-vivo;

(2) Very low α (10 V) allowed quantitation of signal intensity (SI) decay and $T_1$ dynamics in series of up to 12 sequential images, depending on [$O_2$]; analysis of SI decay during defined intervals of exposure to [$O_2$] required higher α (20 V). This allowed the construction of a calibration curve for regional measurement of intraalveolar [$O_2$];

(3) The presence of perfusion, and hence oxygen consumption during apnoea, had a marked influence on $T_1$-derived, as well as on end-apnoeic, intraalveolar [$O_2$]

Conclusions:

Using hyperpolarized $^3$He MRI, calibration of $T_1$-derived estimate of intraalveolar [$O_2$] against end-tidal [$O_2$] is feasible. The influence of different flip angles suggests two possible acquisition routines: (1) dynamic imaging of hyperpolarization decay and exponential fitting of $T_1$ values using very small α, or (2) exact measurement of $^3$He exposure time to oxygen, and imaging using a single acquisition with large α. With both methods, a linear correlation of $T_1$-derived and end-tidal [$O_2$] can be demonstrated. The quantifiable in vivo effect of intrapulmonary $O_2$ upon $T_1$ offers an instrument for analysis of intrapulmonary [$O_2$], time course, and hence its transfer to the blood, with a regional resolution so far unmatched by any conventional method.

EXAMPLE 7

Eight anaesthetized ventilated pigs (28±2 kg) were imaged within a 1.5 T MRI unit at different RF voltages and different inspiratory $O_2$ concentrations [$O_2$]. Using a dedicated applicator, boli of $^3$He polarized up to 35–45% were administered at pre-defined positions within the tidal volume. During subsequent inspiratory apnoea, dynamic images of airways and lungs were acquired (Helmholtz transmitter-receiver coil tuned to 48.4 MHz; 2D FLASH sequences, TR=11 ms/TE=4.2 ms, acquisition time 1 s). The decay of signal intensity in various regions of interest was analysed as a function of RF amplitude and measured end-expiratory [$O_2$] (Fee$O_2$).

Results:

Single-breath, single bolus $^3$He administration was sufficiently accurate and reproducible. Loss of hyperpolarization was negligible. Distribution of $^3$He in tracheobronchial tree and lungs was visualized with a signal-to-noise ratio sufficient for analysis of the decay function (>3). In vivo, $T_1$ of hyperpolarized $^3$He reflected the theoretically predicted relationship to ambient [$O_2$] and RF voltage. Analysis of signal decay within two consecutive images, when acquired at a known Fee$O_2$, allowed for determination of the effective flip angle (α). Introducing a into the analysis of independently acquired image series yielded estimates for regional [$O_2$] which correlated closely with Fee$O_2$(p=0.92).

Conclusions:

In vivo $T_1$ of hyperpolarized $^3$He is mainly determined by the presence of paramagnetic [$O_2$] in the respiratory gas. Knowledge of concurrent Fee$O_2$ concentration allows quantification of flip angle and hyperpolarized $^3$He can be utilized as an indicator of regional alveolar [$O_2$].

EXAMPLE 8

$^3$He gas was hyperpolarized to approximately 40–50% by optical pumping. 12 volunteers and 10 pneurologic patients inhaled such gas from glass cylinders of 300 mL volume and 3 bar pressure. $^3$He-MRI was performed during breathhold using a 3D gradient-recalled-echo imaging sequence on a Siemens 1.5 T clinical scanner, adjusted to have a transmitter frequency of 48.4 MHz and using a Helmholtz transmit/receive RF coil. A flip angle less than 5° was used.

In quantitative studies, faster, repeated 3D images (TR=5 ms, TE=2 ms) were acquired at intervals of 0.8, 16, 42 and 55 seconds in normal volunteers. From these 5 images, extraction of both regional flip angle and regional $T_1$ was possible defining the effects of repeated RF pulsing and longitudinal relaxation in terms of decay rate constants, $\Gamma_{RF}$ and $\Gamma_{RELAX}$ respectively. For a pulse train of duration T, consisting of N pulses of flip angle φ, $\Gamma_{RF}$ is given by:

$$\Gamma_{RF}T = [\cos(\phi)]^N \quad (15)$$

On the other hand, the contribution of longitudinal relaxation depends on absolute time, not on the duration of the RF pulsing. Thus by using a non-linear image timing sequence, the two effects can be resolved and both flip angle and $T_1$ determined regionally.

A final study, using an ultrafast 2D sequence, generated images every 1 second during inspiration, breathhold and expiration.

Results:

All volunteers and 8/10 patients were able to perform the necessary inhalation. One patient was claustrophobic and 1 patient could not maintain a 25-second breathhold. The central airways were consistently visualized. Volunteers demonstrated homogeneous signal intensity; patients with obstructive lung disease and/or pneumonia demonstrated characteristically inhomogeneous signal intensities, specific for the disorder.

Flip angle calibration confirmed an estimated flip angle of 1–2°. $T_1$ was derived to be 32±3 seconds in normal lung. In phantoms, longitudinal relaxation was negligible compared with RF pulsing over a time period of 1 minute (this is consistent with predicted $T_1$ values of tens of hours).

Using the rapid 2D sequence, the inspiratory process could be seen to have a timecourse of less than 1s in normal lung (providing 'instantaneous' uniform signal). Expiration gave rise to slower signal change. The signal reducing effect of expiration could be clearly discriminated from the continuing destruction of polarization by RF pulsing, allowing estimation of hung residual volume.

Conclusion:

$^3$He-MRI with inspiration of hyperpolarized $^3$He provides a means of imaging lung ventilation. Lung filling and ventilatory obstruction can be examined with dynamic MRI. Quantitation, particularly of regional $^3$He $T_1$, provides a means of assessing local physiologic parameters, such as p$O_2$. The simple quantitative approaches described in this Example slow $^3$HE-MRI of the lung provides a modality capable of providing regional functional and physiological information.

EXAMPLE 9

Figure 4:
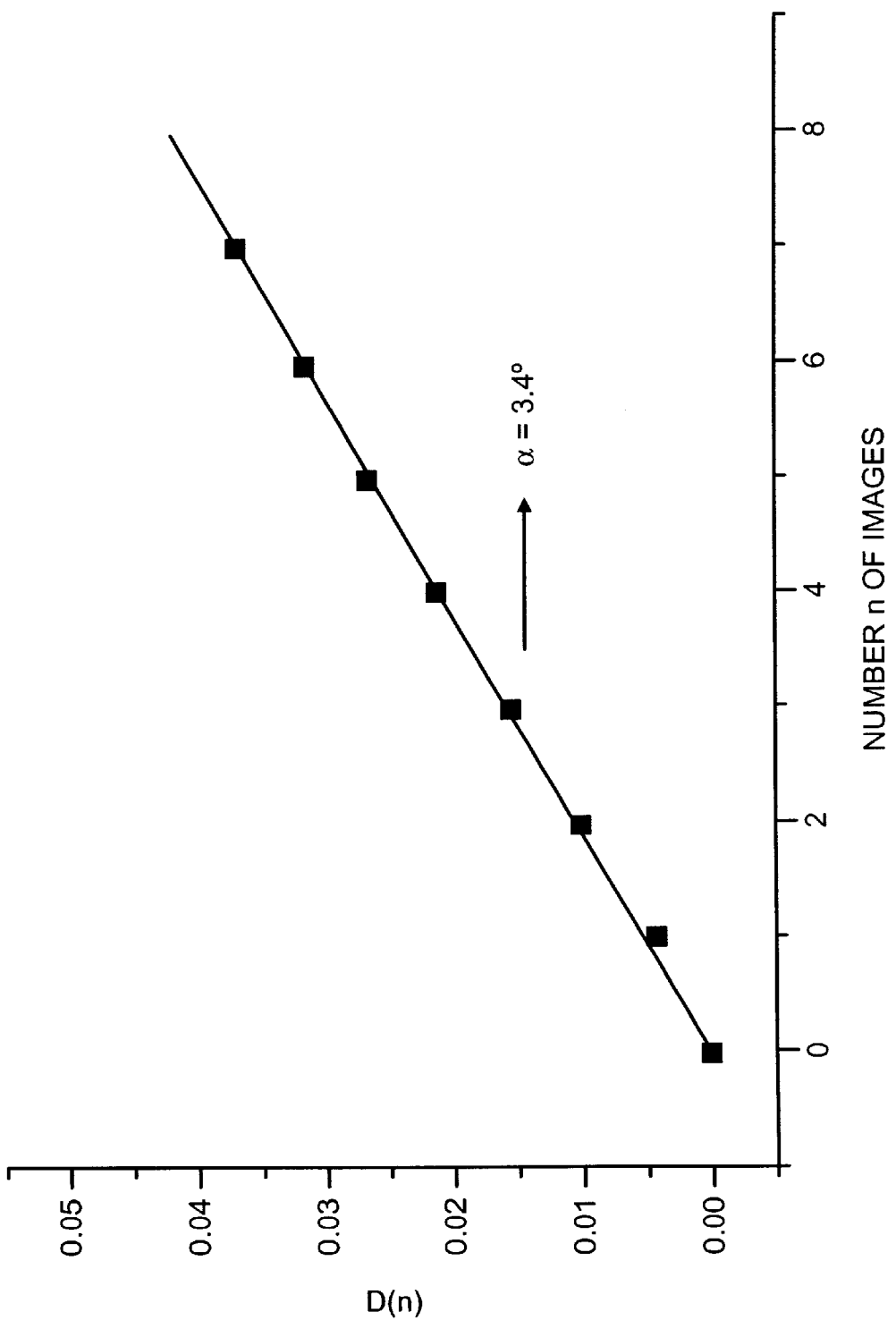
FIG. 4 shows a plot of $D_n$ against number of images (see Example 9)
Figure 5:
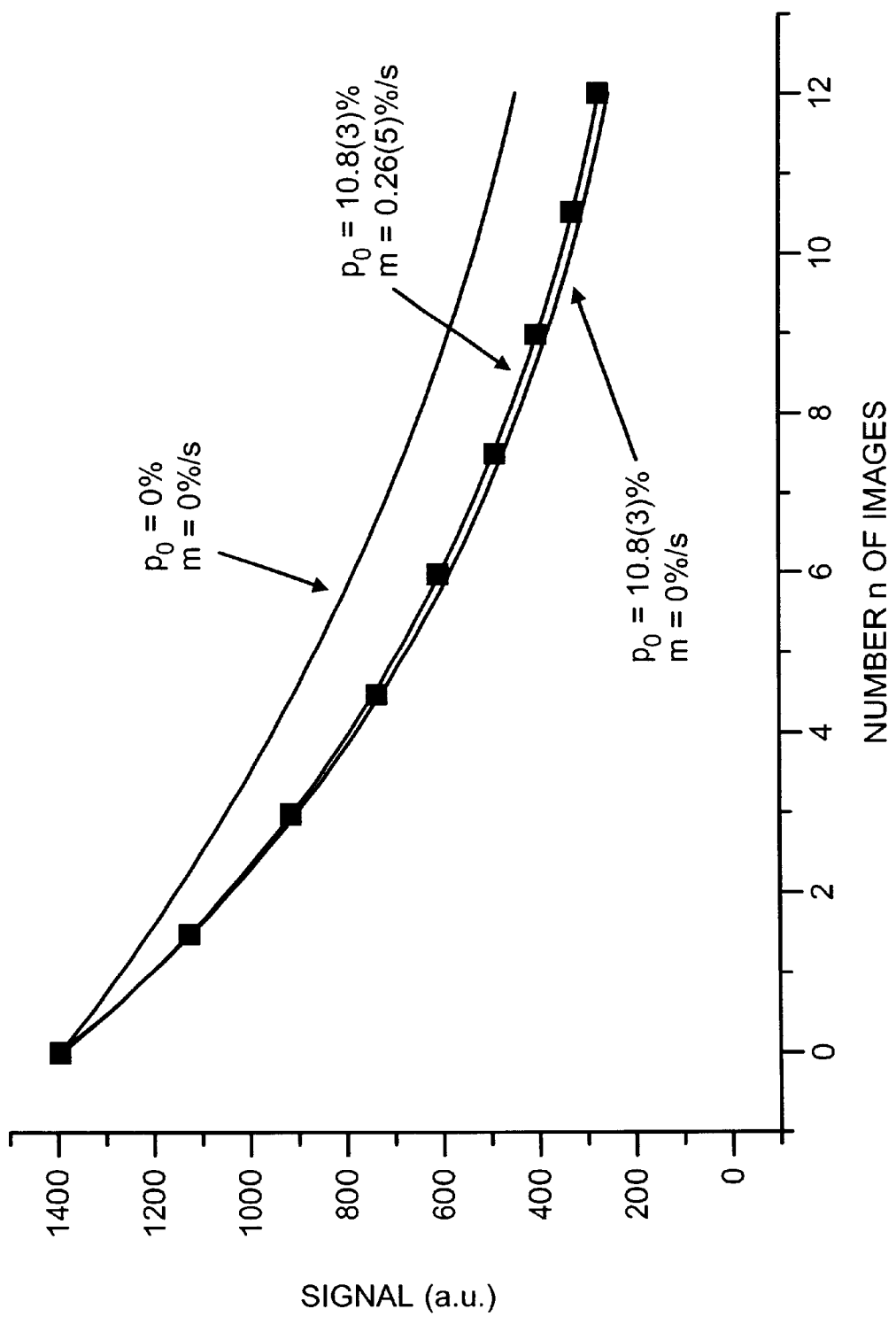
FIG. 5 shows a plot of signal intensity evolution (see Example 9)

Anaesthezied pigs (27 kg) were normoventilated =inside a MRI unit (Siemens Vision scanner with B=1.5 T, equipped with one of two transmit/receive coils resonant to $^3$He at 48.44 MHz). After administering a≈100 cm$^3$ bolus of $^3$He, two series of Turbo 2D FLASH (TE<1 ms, TR 11 ms), images in transversal orientation were taken during breathhold. Predefined RF excitation intensities U were 10 and 20 Volts and intervals τ of 1.5 s were used. Partition thickness was 20 mm. Signal intensities were averaged and analyzed over regions of interests (ROIs). An intensity correction for noise was performed following Gudbjartsson et al. MRM 34: 910–914 (1995). A first postprocessing was performed calculating $R_n = \ln(A_n/A_o)$ for both series, where "ln" denotes the natural logarithm function. Following the dependence $$D_{(n)} \equiv \frac{R_n[10V] - R_n[20v]}{N} = n \ln\left(\frac{\cos\alpha}{\cos 2\alpha}\right) \quad (16)$$

we plotted FIG. 4, showing a linear graph (N total number of images taken, n the considered image number). Solving equation (16) one determines the flip α=3.4°. Knowing this value, one can fit the signal intensity evolution with the image number given in FIG. 5. A linear dependency of the regional partial oxygen pressure proved by other experiments is assumed: $p(t)=p_o-mt$ with time t, coefficient m and pressure $p_o$ at the beginning of the measurement. Thus data are described by $$P(t) = \frac{p_o}{\gamma + \Gamma_{RF}} \left\{ \Gamma_{RF} e^{-} \right.$$

$$\left. \frac{p_o t - \frac{m}{2} t^2}{k} e^{-\gamma t} e^{-} \int \Gamma_{RF}(t) dt + \gamma e^{-\frac{p_o t - \frac{m}{2} t^2}{k}} \right\} \quad (17)$$

where parameters are as defined above (see for example equation (14)). If gas discharge is to be assumed to be very small (and not effect the analysis of the first images, which is true) and γ is set to zero, then a fitting of equation (17) to the data in FIG. 5 yields a $p_o=10.8(3)\%$ and its change with time by m=0.26(5)%/s. Two more theoretical curves indicate the temporal evolution, if no change of partial oxygen pressure takes place (m=0%/s, $p_o=10.8(3)\%$) and if no relaxation by oxygen would be present (m=0%/s, $p_o=0\%$). Both curves indicate, the significant change of partial oxygen pressure. The low number of regional $p_o$ found seems to be real from comparison with other analyses which yield the same flip angles for such excitation intensities.

EXAMPLE 10

Figure 6:
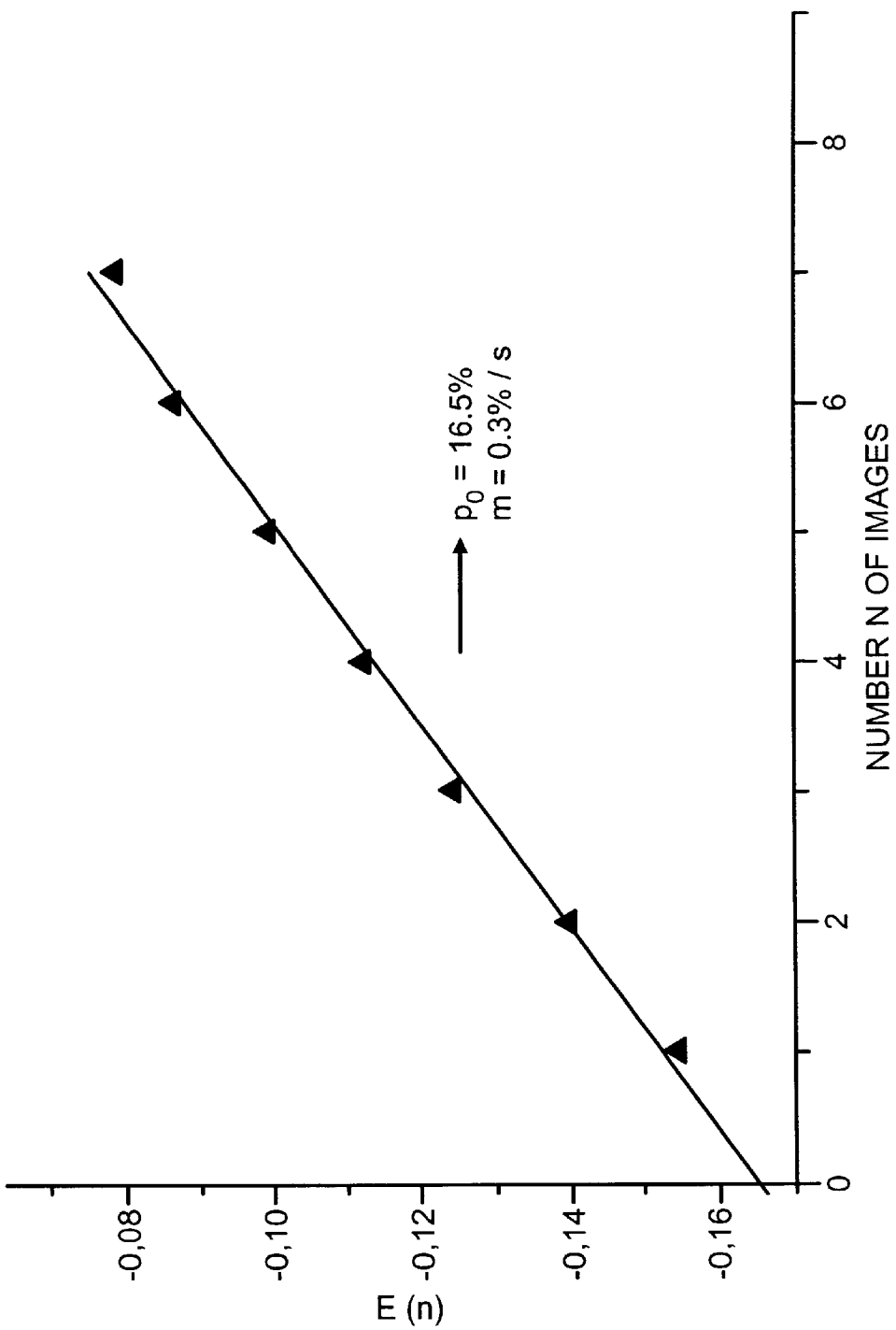
FIG. 6 shows a plot of En against number of images (see Example 10)
Figure 7:
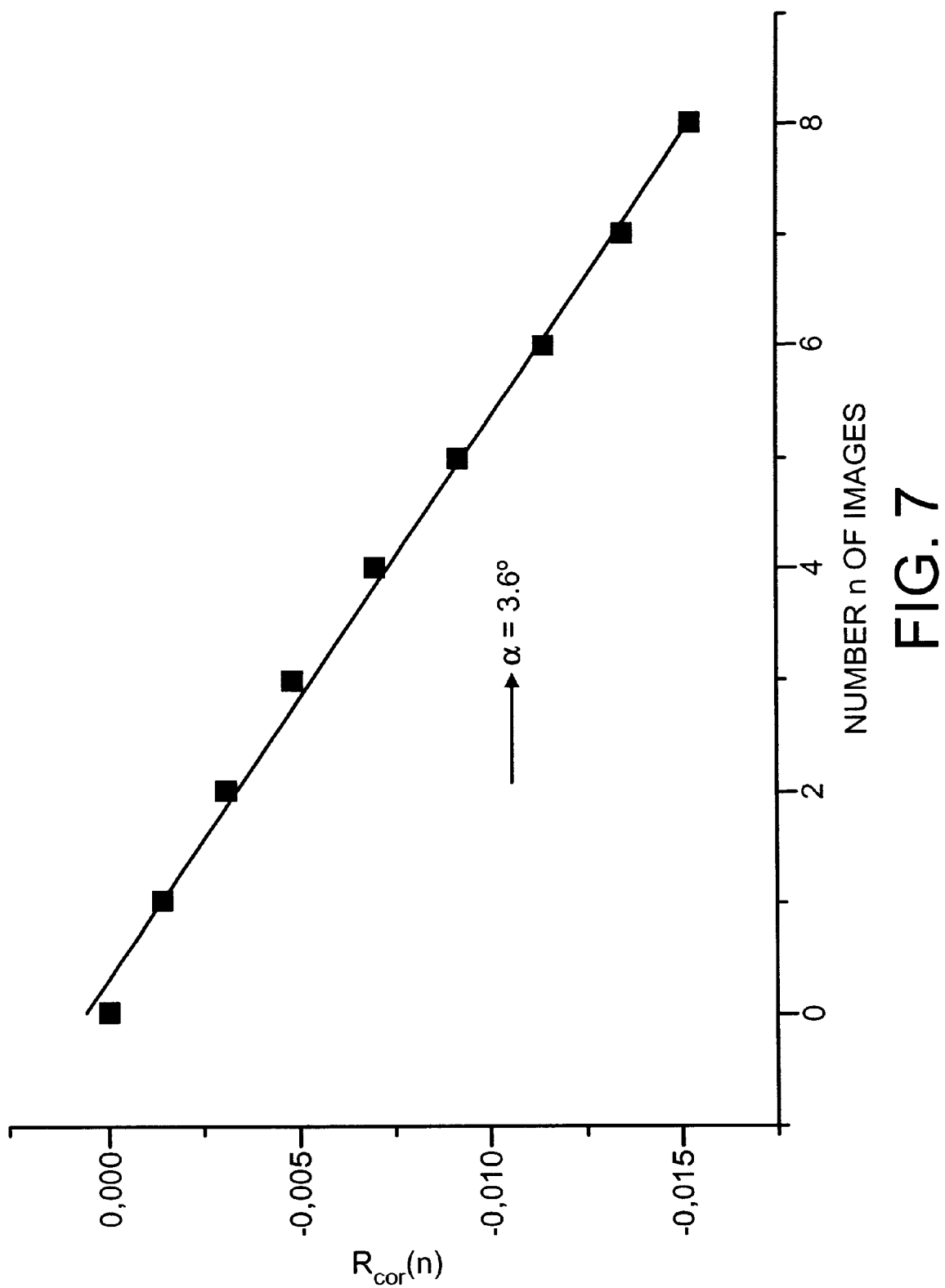
FIG. 7 shows a plot of $R_{corr}$ (n) against number of images (see Example 10)

Anaesthezied pigs (27 kg) were normoventilated inside a MRI unit (Siemens Vision scanner with B=1.5 T, equipped with one of two transmit/receive coils resonant to $^3$He at 48.44 MHz). After administering a≈100 cm$^3$ bolus of $^3$He, two series of Turbo 2D FLASH (TE<1 ms, TR 11 ms) images in coronal orientation were taken during breathhold. Predefined RF excitation intensities U were 10 Volts and intervals $\tau_1$ of 1.5 s and $\tau_2$ of 7 s were used. Partition thickness was 120 mm. The large thickness suppresses gas exchange phenomena which would affect the analysis of change of partial oxygen pressure. Signal intensities were averaged and analyzed over regions of interests (ROIs). An intensity correction for noise was performed following Gudbjartsson et al. supra. A first postprocessing was performed calculating $R_n = \ln(A_n/A_o)$ for both series, where "ln" denotes the natural logarithm function. Following the dependence $$E_n \equiv \frac{k \cdot (R_n(\tau_1) - R_n(\tau_2))}{n \cdot (\tau_1 - \tau_2)} = \frac{m}{2} n_{(\tau_1 + \tau_2)} - p_o \quad (18)$$

one can extract $p_o=16.5\%$ and m=0.3%/s from the linear graph as shown in FIG. 6. Knowing the temporal oxygen dependence (supposed to be linear as in Example 9) one uses $$R_{corr}(n) = \frac{R_n + \frac{1}{k}\left(p_o t_n - \frac{m}{2} t_n^2\right)}{N} = n \ln(\cos\alpha) \quad (19)$$

to get a linear dependency in ln(cos α) from where α=3.6° is found (see FIG. 7).

EXAMPLE 11

Figure 8:
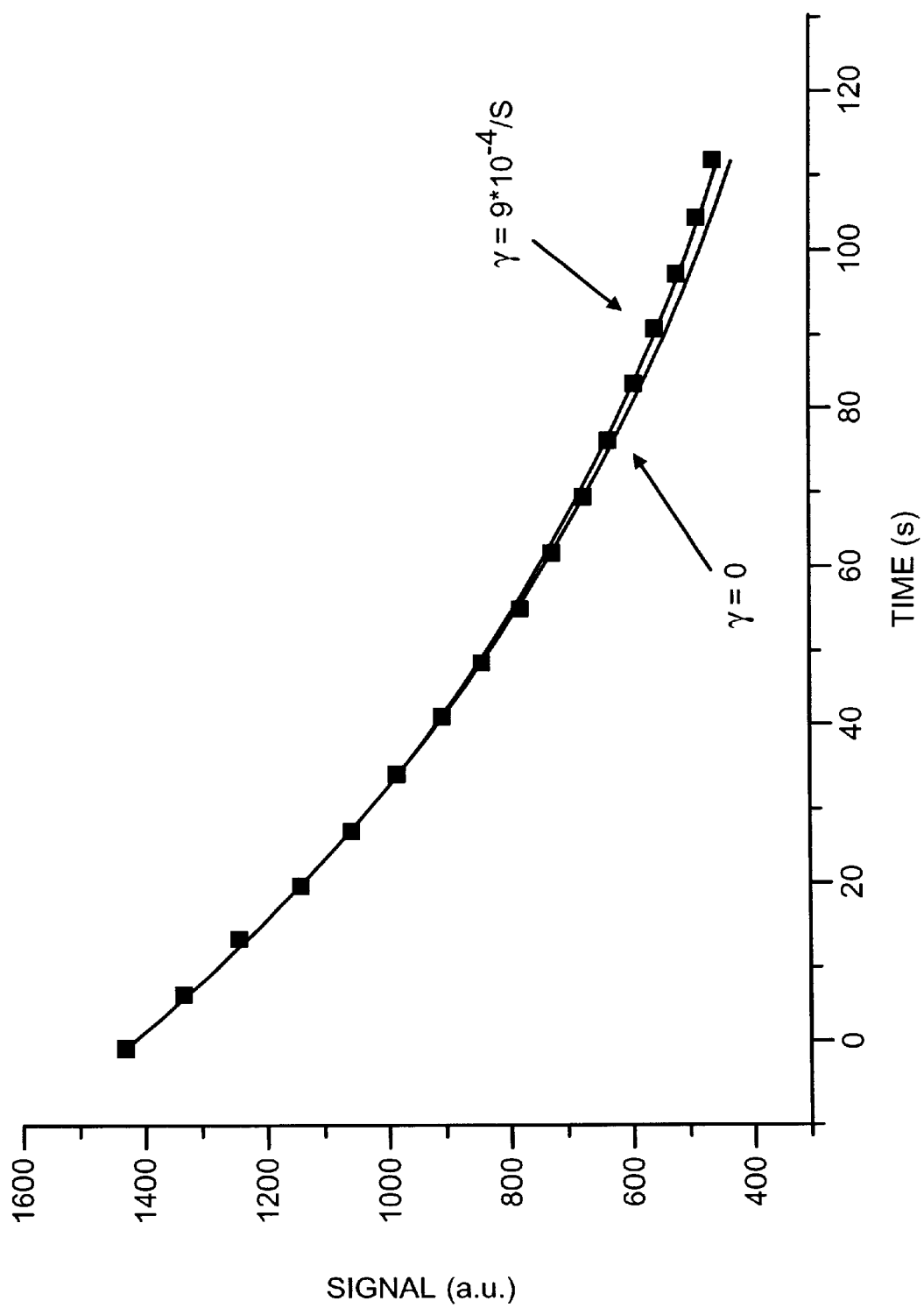
FIG. 8 shows a plot of temporal dependance of mr signal (see Example 11)

Anaesthezied pigs (27 kg) were normoventilted inside a MRI unit (Siemens Vision scanner with B=1.5 T, equipped with one of two transmit/receive coils resonant to $^3$He at 48.44 MHz). After administering a≈100 cm$^3$ bolus of $^3$He, two series of Turbo 2D FLASH (TE <1 ms, TR 11 ms) images in coronal orientation were taken during breathhold. Predefined RF excitation intensities U were 5 Volts and 10 Volts and an interval τ of 7 s were used. Partition thickness was 120 mm. The large thickness was chosen to suppresses major gas exchange phenomena which would effect the analysis of change of partial oxygen pressure. Signal intensities were averaged and analysed over regions of interest (ROIs). An intensity correction for noise was performed following Gudjartsson, et al. supra. Before administering the $^3$He bolus, cardiac arrest was set and oxygen was washed out by 5 minutes breathing pure $N_2$ gas. Thus, partial oxygen pressure was below 1%, controlled by measuring $p_o$ in the exhaled gas. Data analysis was started as in Example 9 above. FIG. 8 shows the temporal signal dependence versus time. Since oxygen pressure was assumed to be stable, parameter m was set to zero. Partial oxygen pressure $p_o \leq 0.9\%$ was fitted. Assuming no oxygen was present, but all relaxation was caused by wall relaxation of lung tissue, the same relaxation rate can be explained by a $T_1^{wall} \geq 247$ s (about 4 minutes). If gas exchange is neglected by setting γ to zero, last points are not fitted. A correction yields γ=9×10$^{-4}$/s, which can be interpreted as diffusion of gas from less excited lung spaces (top or bottom) to central lung regions. A diffusional effect was also seen in the trachea, not visible at the beginning but slowly filled with hyperpolarized $^3$He gas during data acquisition.

Figure 9:
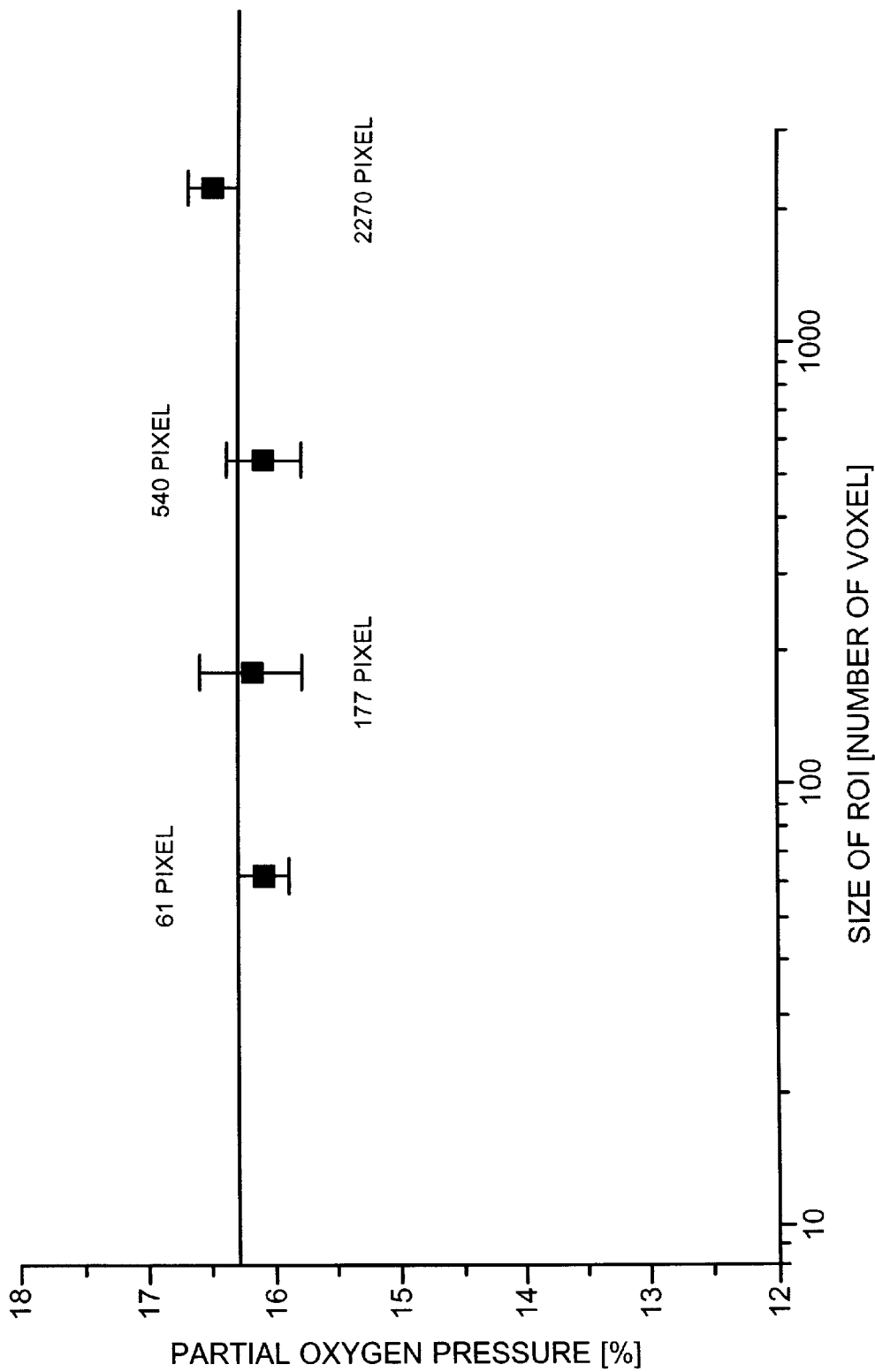
FIG. 9 shows a plot of dependence of $pO_2$ on ROI size (see Example 11)

FIG. 9 shows the weak dependence of determination of partial oxygen pressure from ROI size. As long as the intensity distribution over the analysed ROI has a Rician distribution, sizes down to 1 cm$^2$ (60 pixel) can be analysed with high accuracy. (It should be noted however that the intensity distribution of the ROI containing 2270 pixel in FIG. 9 is not totally Rician and is thus uncertain).

Figure 10:
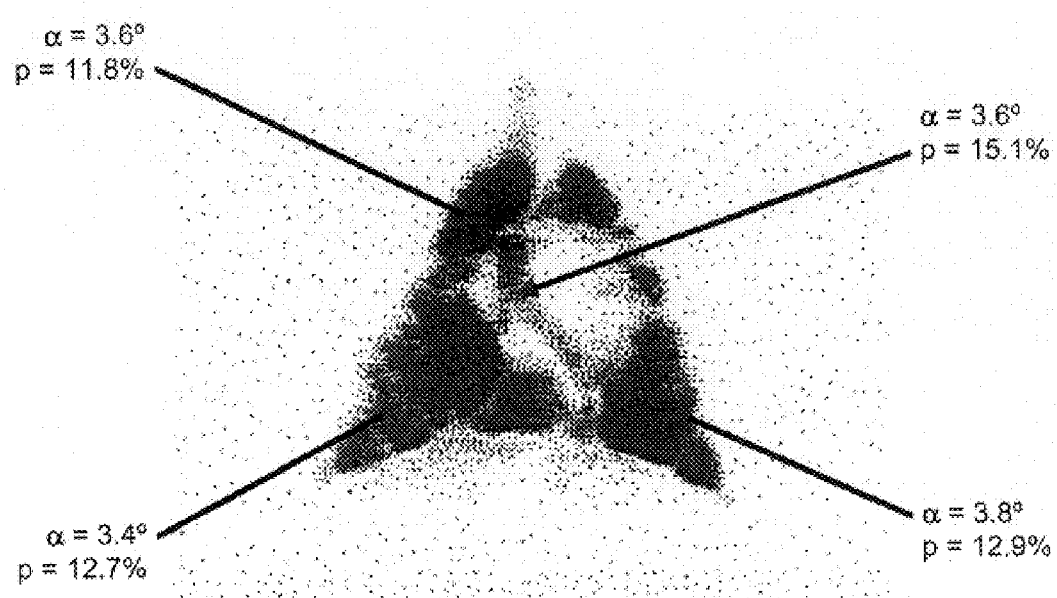
FIG. 10 shows an mr image indicative of $pO_2$ (see Example 11).

FIG. 10 shows the results of several ROI's regional partial oxygen pressure and flip angle. The experiment was continued by ventilating the animal with $p_o=21\%$. FIG. 10 shows one coronal view of two image series taken with the same sequence parameters. Data analysis was done in the same way. The $O_2$-wash-in was not complete as comparison of values of $p_o$ from alveolar space and trachea demonstrate. Flip angle α is rather homogeneous over the field of view.

What is claimed is:

1. A method for estimating the lung volume of an air-breathing animal subject, said method comprising administering into the lungs of said subject an effective amount of a gaseous hyperpolarized magnetic resonance imaging agent, and monitoring the hyperpolarization value of said hyperpolarized agent to determine the integrate magnetic resonance signal following inhalation of said hyperpolarized agent without air, breathhold and expiration, wherein the expired volume is measured directly and the residual hyperpolarization of the retained hyperpolarized agent is extrapolated from the hyperpolarization value monitored during breathhold.

2. A method as claimed in claim 1 wherein said hyperpolarized agent is $^3$He.

3. A method as claimed in claim 1 wherein the $^3$He has a polarization degree of 10 to 50%.

4. A method as claimed in claim 1 wherein said hyperpolarized agent is administered as a bolus.

5. A method as claimed in claim 4 wherein said hyperpolarized agent is administered to a human as a bolus of volume 1 to 1000 mL.

6. A method as claimed in claim 1 wherein said breathhold is effected during a period of at least 1 second.

7. A method as claimed in claim 1 wherein a mr imager with a primary field strength in the range of 0.05 to 3.5 T is used to detect the magnetic resonance signal.

* * * * *